US011205662B2

(12) United States Patent
Liu et al.

(10) Patent No.: US 11,205,662 B2
(45) Date of Patent: Dec. 21, 2021

(54) METHODS FOR REDUCING DEFECTS IN SEMICONDUCTOR PLUG IN THREE-DIMENSIONAL MEMORY DEVICE

(71) Applicant: YANGTZE MEMORY TECHNOLOGIES CO., LTD., Wuhan (CN)

(72) Inventors: Fandong Liu, Wuhan (CN); Wenyu Hua, Wuhan (CN); Jia He, Wuhan (CN); Linchen Wu, Wuhan (CN); Yue Qiang Pu, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/994,493

(22) Filed: Aug. 14, 2020

(65) Prior Publication Data
US 2020/0381451 A1 Dec. 3, 2020

Related U.S. Application Data

(60) Division of application No. 16/194,311, filed on Nov. 17, 2018, now Pat. No. 10,784,279, which is a
(Continued)

(51) Int. Cl.
*H01L 27/11582* (2017.01)
*H01L 21/311* (2006.01)
(Continued)

(52) U.S. Cl.
CPC ... *H01L 27/11582* (2013.01); *H01L 21/31111* (2013.01); *H01L 21/76805* (2013.01);
(Continued)

(58) Field of Classification Search
CPC ......... H01L 21/02178; H01L 21/02181; H01L 21/02183; H01L 21/02186;
(Continued)

(56) References Cited

U.S. PATENT DOCUMENTS

2012/0068255 A1* 3/2012 Lee .................. H01L 27/11565
257/324
2012/0161094 A1 6/2012 Huo et al.
(Continued)

FOREIGN PATENT DOCUMENTS

CN 101465324 A 6/2009
CN 107305896 A 10/2017
(Continued)

OTHER PUBLICATIONS

International Search Report issued in corresponding International Application No. PCT/CN2018/109400, dated Jul. 24, 2019, 5 pages.
(Continued)

*Primary Examiner* — Mohammed R Alam
(74) *Attorney, Agent, or Firm* — Bayes PLLC

(57) ABSTRACT

Embodiments of 3D memory devices with a dielectric etch stop layer and methods for forming the same are disclosed. In an example, a method for forming a 3D memory device is disclosed. The method includes forming a dielectric etch stop layer. The dielectric etch stop is disposed on a substrate. The method also includes forming a dielectric stack on the dielectric etch stop layer. The dielectric stack includes a plurality of interleaved dielectric layers and sacrificial layers. The method further includes forming an opening extending vertically through the dielectric stack and extending the opening through the dielectric etch stop layer. In addition, the method includes forming a selective epitaxial growth (SEG) plug at a lower portion of the opening. The SEG plug is disposed on the substrate. Moreover, the method includes
(Continued)

forming a channel structure above and in contact with the SEG plug in the opening. The method further includes forming a memory stack comprising a plurality of interleaved dielectric layers and conductor layers by replacing the sacrificial layers in the dielectric stack with the conductor layers.

20 Claims, 12 Drawing Sheets

Related U.S. Application Data continuation of application No. PCT/CN2018/109400, filed on Oct. 9, 2018.

(51) Int. Cl.
*H01L 21/768* (2006.01)
*H01L 23/535* (2006.01)
*H01L 27/11556* (2017.01)
*H01L 21/02* (2006.01)

(52) U.S. Cl.
CPC .. *H01L 21/76829* (2013.01); *H01L 21/76879* (2013.01); *H01L 21/76895* (2013.01); *H01L 23/535* (2013.01); *H01L 27/11556* (2013.01); H01L 21/02178 (2013.01); H01L 21/02181 (2013.01); H01L 21/02183 (2013.01); H01L 21/02186 (2013.01); H01L 21/02189 (2013.01)

(58) Field of Classification Search
CPC ......... H01L 21/02189; H01L 27/11582; H01L 21/31111; H01L 21/76805; H01L 21/76829; H01L 21/76879; H01L 21/76895; H01L 23/535; H01L 27/11556; H01L 27/11578

See application file for complete search history.

(56) References Cited

U.S. PATENT DOCUMENTS

| | | | |
|---|---|---|---|
| 2013/0161818 A1* | 6/2013 | Han | H01L 27/0688 257/751 |
| 2014/0070302 A1* | 3/2014 | Yoo | H01L 27/11582 257/324 |
| 2015/0060977 A1* | 3/2015 | Lee | H01L 27/1157 257/314 |
| 2017/0154892 A1 | 6/2017 | Oh | |
| 2017/0243886 A1 | 8/2017 | Lee et al. | |
| 2018/0122904 A1 | 5/2018 | Matsumoto et al. | |
| 2018/0130812 A1 | 5/2018 | Hosoda et al. | |

FOREIGN PATENT DOCUMENTS

| | | |
|---|---|---|
| CN | 107408559 A | 11/2017 |
| CN | 107507831 A | 12/2017 |
| CN | 107527920 A | 12/2017 |
| CN | 107658315 A | 2/2018 |
| CN | 107658317 A | 2/2018 |
| CN | 107731838 A | 2/2018 |
| KR | 20140093106 A | 7/2014 |
| WO | 2013078068 A1 | 5/2013 |

OTHER PUBLICATIONS

Written Opinion of the International Searching Authority issued in corresponding International Application No. PCT/CN2018/109400, dated Jul. 24, 2019, 4 pages.

* cited by examiner

METHODS FOR REDUCING DEFECTS IN SEMICONDUCTOR PLUG IN THREE-DIMENSIONAL MEMORY DEVICE

CROSS REFERENCE TO RELATED APPLICATION

This application is division of U.S. application Ser. No. 16/194,311, filed on Nov. 17, 2018, entitled "METHODS FOR REDUCING DEFECTS IN SEMICONDUCTOR PLUG IN THREE-DIMENSIONAL MEMORY DEVICE," which is continuation of International Application No. PCT/CN2018/109400, filed on Oct. 9, 2018, entitled "METHODS FOR REDUCING DEFECTS IN SEMICONDUCTOR PLUG IN THREE-DIMENSIONAL MEMORY DEVICE," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells.

The 3D memory architecture includes a memory array and peripheral devices for controlling signals to and from the memory array.

SUMMARY

Embodiments of 3D memory devices with a dielectric etch stop layer for reducing defects in a semiconductor plug and methods for forming the same are disclosed herein.

In one example, a method for forming a 3D memory device is disclosed. The method includes forming a dielectric etch stop layer. The dielectric etch stop is disposed on a substrate. The method also includes forming a dielectric stack on the dielectric etch stop layer. The dielectric stack includes a plurality of interleaved dielectric layers and sacrificial layers. The method further includes forming an opening extending vertically through the dielectric stack and extending the opening through the dielectric etch stop layer. In addition, the method includes forming a selective epitaxial growth (SEG) plug at a lower portion of the opening. The SEG plug is disposed on the substrate. Moreover, the method includes forming a channel structure above and in contact with the SEG plug in the opening. The method further includes forming a memory stack comprising a plurality of interleaved dielectric layers and conductor layers by replacing the sacrificial layers in the dielectric stack with the conductor layers.

In another example, a method for forming a semiconductor structure is disclosed. The method includes forming a dielectric etch stop layer. The dielectric etch stop layer is disposed on a substrate. The method also includes forming a plurality of interleaved dielectric layers and sacrificial layers on the dielectric etch stop layer. The method further includes forming an opening extending vertically through the interleaved dielectric layers and sacrificial layers and extending the opening through the dielectric etch stop layer. In addition, the method includes forming a SEG plug at a lower portion of the opening. The SEG plug is disposed on the substrate.

In still another example, a 3D memory device is disclosed. The memory device includes a substrate and a dielectric etch stop layer disposed on the substrate. The memory device also includes a memory stack disposed on the dielectric etch stop layer. The memory stack includes a plurality of interleaved conductor layers and dielectric layers. The memory device further includes a plurality of memory strings each extending vertically through the memory stack and including a SEG plug in a bottom portion of the memory string. The SEG plug is disposed on the substrate.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
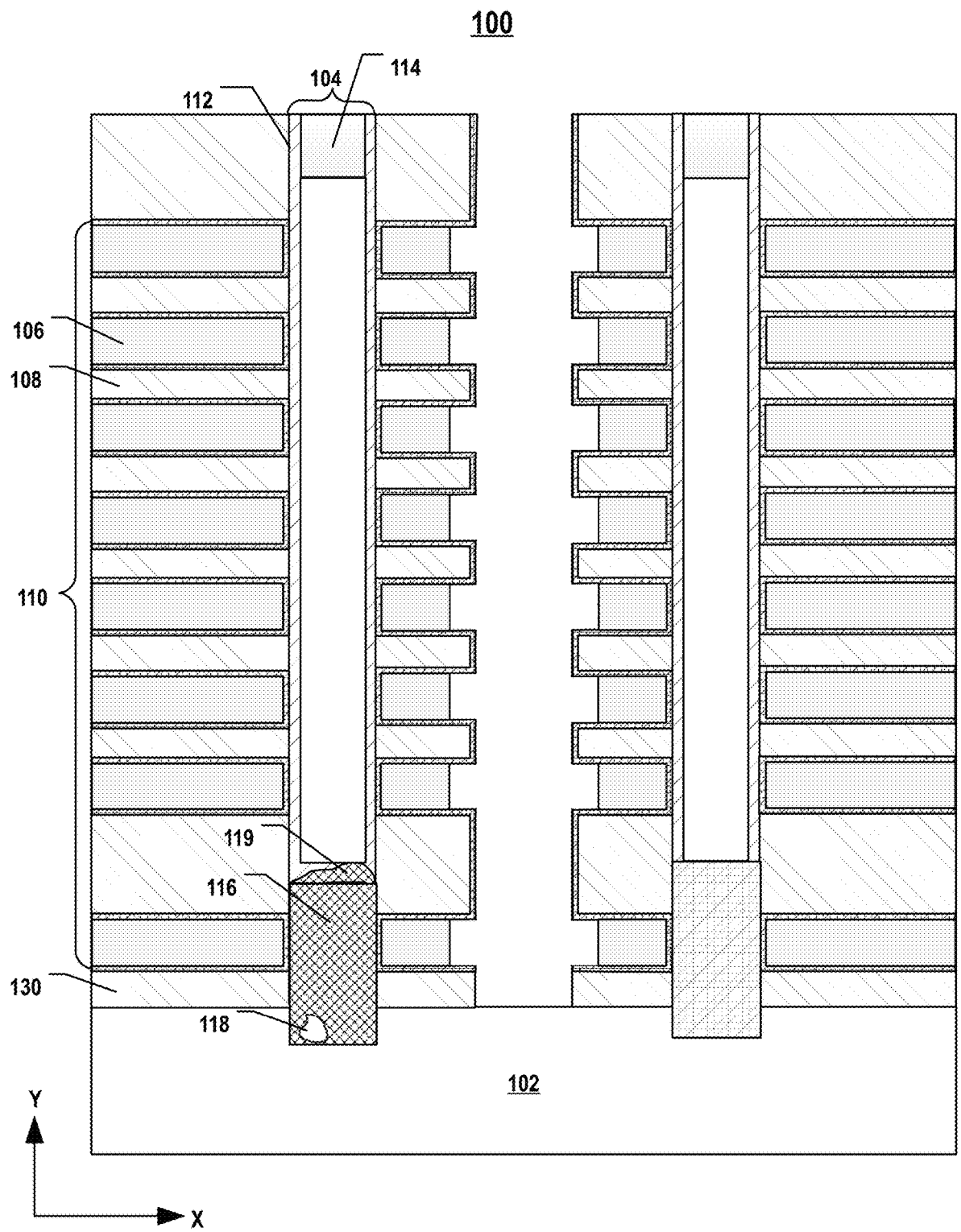
FIG. 1A illustrates a cross-section of an exemplary 3D memory device having defects in a semiconductor plug.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a semiconductor plug is typically formed at one end of a NAND memory string. The semiconductor plug acts as a channel of a transistor when combined with a gate conductor layer formed surrounding it. The semiconductor plug can be formed through a selective epitaxial growth (SEG) process, in which the semiconductor plug is epitaxially grown from a substrate through an opening of an insulation layer, typically made by depositing a layer of silicon oxide on the substrate. A semiconductor plug formed through the SEG process is also referred to as an SEG plug. In some cases, the deposited silicon oxide may not be dense enough, resulting in a release of nitrogen (e.g., previously infused with the silicon oxide and/or from a silicon nitride layer or a silicon oxynitride layer close to the substrate) due to the high temperature environment in the SEG process. The nitrogen may accumulate and attach to the surface of the substrate, affecting the uniformity of the growth and causing defects in the semiconductor plug. The defected semiconductor plug may shift the turn-on voltage of the transistor or even collapse, destroying the entire block of the 3D memory cells. The negative impact of a defected semiconductor plug can cause loss in yield and reliability of a 3D memory device.

In addition, deposited silicon oxide in the insulation layer may not be able to withstand etching, a process used to form an opening for growing the semiconductor plug. As a result, at least part of the deposited silicon oxide may be etched through, thereby exposing the substrate underneath to the etching composition and causing damage to the substrate. The subsequent growth of the silicon from such a damaged substrate may result in a semiconductor plug having its bottom part extending into the substrate, which is undesirable in some cases.

Various embodiments in accordance with the present disclosure provide fabrication methods of a 3D memory device having a dielectric etch stop layer for reducing defects in a semiconductor plug. A dielectric etch stop layer may be made from a high-dielectric constant (high-k) material or native oxide. The dielectric etch stop layer can prevent high energy ions from damaging the surface of the substrate, thereby retaining its uniform lateral dimension at the end of the fabrication process. In addition, the dielectric etch stop layer may prevent nitrogen from accumulating on and/or attaching to the surface of the substrate, reducing or even preventing defects from forming in the semiconductor plug. The above-noted drawbacks caused by existing fabrication flow can thus be overcome, and the yield and reliability of the 3D memory device can be improved.

One step of utilizing the dielectric etch stop layer to reduce defects in the semiconductor plug is to add to or replace the lowest dielectric layer (i.e., the dielectric layer closest to the substrate), typically made of silicon oxide, with a native oxide or a high-k dielectric material such as aluminum oxide ($Al_2O_3$), hafnium oxide ($HfO_2$) tantalum oxide ($Ta_2O_5$), zirconium oxide ($ZrO_2$), titanium oxide ($TiO_2$), or any combination thereof. In some embodiments, the dielectric etch stop layer is first formed on the substrate (e.g., by depositing a high-k dielectric layer or oxidizing part of the substrate to form a native oxide layer), followed by forming of a dielectric stack having interleaved sacrificial layers and dielectric layers. Then, an opening extending vertically through the dielectric stack is formed by, for example, etching. In some embodiments, the etching may be stopped at the dielectric etch stop layer, which protects the silicon underneath from exposing to the compositions used in the etching process. Next, the opening is extended further through the dielectric etch stop layer by, for example, punching. After that, SEG process may commence to grow the semiconductor plug. The semiconductor plug may be disposed on the substrate instead of extending into the substrate.

FIG. 1A illustrates a cross-section of an exemplary 3D memory device 100 with a defected semiconductor plug 116. For example, semiconductor plug 116 may include a defect 118, such as a void, as a result of nitrogen accumulation and/or attachment during the SEG process. Semiconductor plug 116 may also include a defect 119 at the upper surface (e.g., an uneven surface), resulting from uneven growth caused by defect 118. It is noted that x and y axes are included in FIG. 1 to further illustrate the spatial relationship of the components in 3D memory device 100. A substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the y-direction (i.e., the vertical direction) when the substrate is positioned in the lowest plane of the semiconductor device in the y-direction. The same notion for describing spatial relationship is applied throughout the present disclosure.

3D memory device 100 is a NAND Flash memory device in which memory cells are provided in the form of an array of NAND memory strings 104 extending vertically above substrate 102. In some embodiments, 3D memory device 100 includes NAND memory strings 104 that extend through a plurality of pairs each including a conductor layer 106 and a dielectric layer 108 (referred to herein as "conductor/dielectric layer pairs"). The stacked conductor/dielectric layer pairs are also referred to herein as a "memory stack" 110. In some embodiments, each NAND memory string 104 includes a channel structure 112 extending vertically through memory stack 110. NAND memory string 104, according to some embodiments, further includes a channel plug 114 and a semiconductor plug 116 each at a respective end in the y-direction.

Figure 1B:
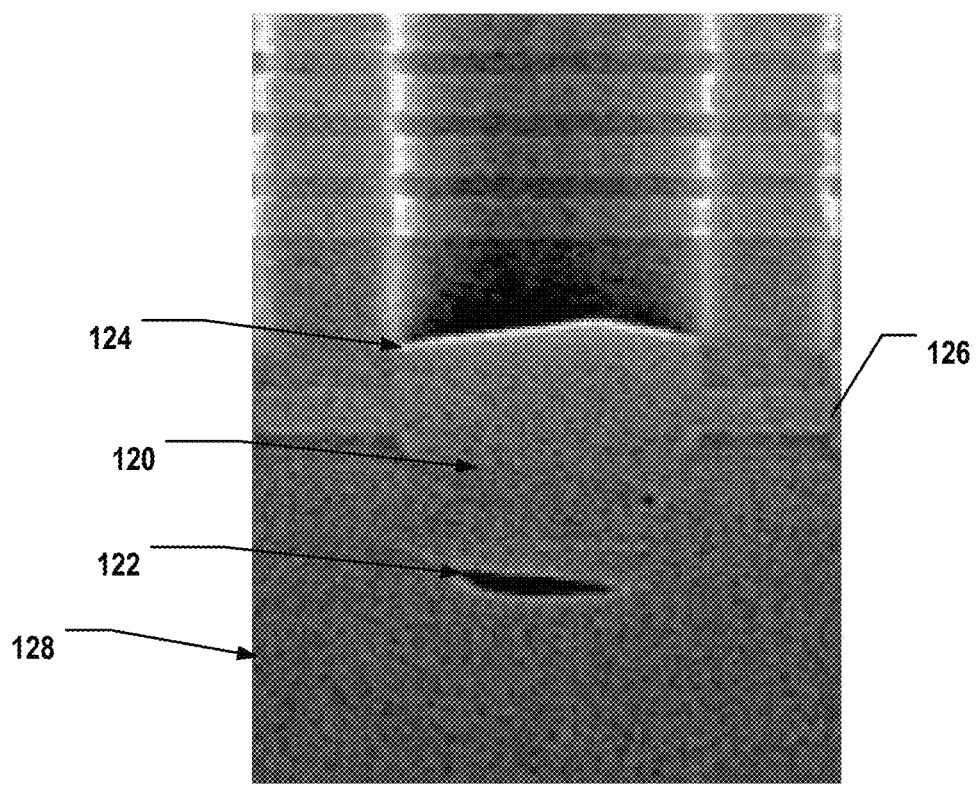
FIG. 1B is an image depicting exemplary defects in a semiconductor plug of a 3D memory device.
Figure 1B:
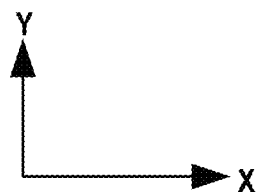

As shown in FIG. 1, an insulation layer 130 is disposed between substrate 102 and memory stack 110. Typically, insulation layer 130 is formed by depositing silicon oxide, which is considered having relatively low density. During the SEG process, nitrogen may be released due to the high temperature environment, and attach to the surface of substrate 102, causing defects. As shown in FIG. 1, semiconductor plug 116 at the lower end of NAND memory string 104 has defects (e.g., 118 and 119) due to nitrogen attachment to the surface of substrate 102 during the SEG process and thus, may adversely affect its electrical performance or even lose its electrical contact to channel structure 112. In addition, as shown in FIG. 1A, semiconductor plug 116 extends into substrate 102, as a result of damage sustained by substrate 102 during the etching process due to the inability of insulation layer 130 to stop the etch composition from reaching substrate 102.

FIG. 1B is an image depicting an exemplary cross-sectional profile of the lower portion of a semiconductor plug 120 having a defect 122 caused by nitrogen attachment, which in turn causes an uneven upper surface 124. As shown in FIG. 1B, semiconductor plug 120 extends into a substrate 128, passing beyond an insulation layer 126.

Figure 2:
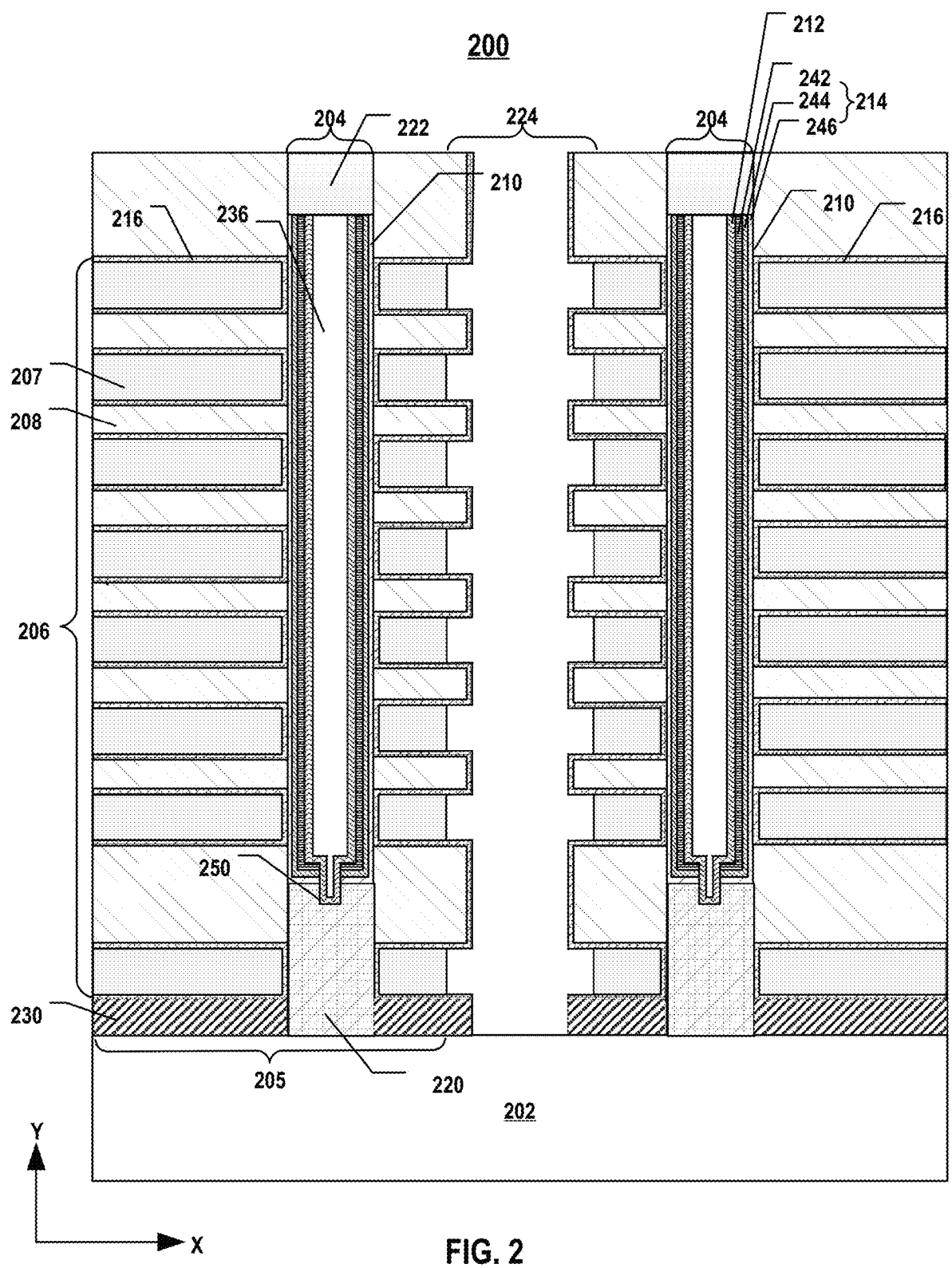
FIG. 2 illustrates a cross-section of an exemplary 3D memory device having a dielectric etch stop layer for reducing defects in a semiconductor plug, according to some embodiments of the present disclosure.

In contrast, a 3D memory device with a dielectric etch stop layer close to the surface of the substrate can reduce or even prevent defect formation in the semiconductor plug, and therefore does not share the same issues as described above with reference to FIGS. 1A and 1B. FIG. 2 illustrates a cross-section of an exemplary 3D memory device 200 having a dielectric etch stop layer 230, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, wet/dry etching, chemical mechanical polishing (CMP), or any combination thereof.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 200 is a NAND Flash memory device in which memory cells are provided in the form of array of NAND memory strings 204 extending vertically above substrate 202. The memory array device can include NAND memory strings 204 that extend through a plurality of pairs each including a conductor layer 207 and a dielectric layer 208 (referred to herein as "conductor/dielectric layer pairs"). The stacked conductor/dielectric layer pairs are also referred to herein as a "memory stack" 206. The number of the conductor/dielectric layer pairs in memory stack 206 (e.g., 32, 64, 96, or 128) can set the number of memory cells in 3D memory device 200. Conductor layers 207 and dielectric layers 208 in memory stack 206 can alternate in the vertical direction. In other words, except the ones at the top and the bottom of memory stack 206, each conductor layer 207 can be adjoined by two dielectric layers 208 on both sides, and each dielectric layer 208 can be adjoined by two conductor layers 207 on both sides. Conductor layers 207 can each have the same thickness or have different thicknesses. Similarly, dielectric layers 208 can each have the same thickness or have different thicknesses. Conductor layers 207 can include conductive materials including, but not limited to, tungsten (W), cobalt (Co), copper (Cu), aluminum (Al), polysilicon, doped silicon, silicides, or any combination thereof. Dielectric layers 208 can include dielectric materials including, but not limited to, silicon oxide, silicon nitride, silicon oxynitride, or any combination thereof.

As shown in FIG. 2, each NAND memory string 204 can include a channel structure 210 extending vertically through memory stack 206. Channel structure 210 can include a channel hole filled with semiconductor material(s) (e.g., as a semiconductor channel 212) and dielectric material(s) (e.g., as a memory film 214). In some embodiments, semiconductor channel 212 includes silicon, such as amorphous silicon, polysilicon, or single crystalline silicon. In some embodiments, memory film 214 is a composite layer including a tunneling layer 242, a storage layer 244 (also known as a "charge trap/storage layer"), and a blocking layer 246. The remaining space of channel structure 210 can be partially or fully filled with a filling layer 236 including dielectric materials, such as silicon oxide. Channel structure 210 can have a cylinder shape (e.g., a pillar shape). Filling layer 236, semiconductor channel 212, tunneling layer 242, storage layer 244, and blocking layer 246 are arranged radially from the center toward the outer surface of the pillar in this order, according to some embodiments. Tunneling layer 242 can include silicon oxide, silicon oxynitride, or any combination thereof. Storage layer 244 can include silicon nitride, silicon oxynitride, silicon, or any combination thereof. Blocking layer 246 can include silicon oxide, silicon oxynitride, high-k dielectrics, or any combination thereof. In one example, memory film 214 can include a composite layer of silicon oxide/silicon oxynitride/silicon oxide (ONO).

In some embodiments, NAND memory strings 204 and memory stack 206 collectively form NAND memory cell stacks 205. Conductor layer 207 (each being part of a word line) in memory stack 206 can function as a gate conductor of memory cells in NAND memory cell stack 205. Conductor layer 207 can include multiple control gates of multiple NAND memory cell stacks 205 and can extend laterally as a word line ending at the edge of memory stack 206 (e.g., in a staircase structure of memory stack 206). In some embodiments, NAND memory cell stack 205 further includes a gate dielectric layer 216 disposed laterally between conductor layer 207 and memory film 214. Gate dielectric layer 216 can increase the gate capacitance of each memory cell, as well as suppress the leakage current from one gate to its neighboring gates due to its all-around coverage on the control gate. Gate dielectric layer 216 can include materials including, but not limited to, silicon nitride, high-k dielectrics, such as $Al_2O_3$, $HfO_2$, $Ta_2O_5$, or any combination thereof. In some embodiments, NAND memory cell stack 205 includes conductor layers 207 (as the gate conductors of memory cell transistors) made from tungsten, glue layers (not shown) including titanium/titanium nitride (Ti/TiN) or tantalum/tantalum nitride (Ta/TaN), gate dielectric layers 216 made from a high-k dielectric material, and channel structures 210.

In some embodiments, NAND memory string 204 includes a semiconductor plug 220 and a channel plug 222 each at a respective end in the vertical direction. Each of semiconductor plug 220 and channel plug 222 can be in contact with a respective end of channel structure 210. Semiconductor plug 220 can be at the lower end (bottom portion) of NAND memory string 204 and in contact with channel structure 210 (e.g., on the lower end of channel structure 210) through a semiconductor contact 250. Semiconductor plug 220 can also be in contact with substrate 202 at an upper surface of substrate 202. As used herein, the "upper end" of a component (e.g., NAND memory string 204) is the end farther away from substrate 202 in the y-direction, and the "lower end" of the component (e.g., NAND memory string 204) is the end closer to substrate 202 in the y-direction when substrate 202 is positioned in the lowest plane of 3D memory device 200. Semiconductor plug 220 can include a semiconductor material, such as silicon, which is epitaxially grown from substrate 202. It is understood that in some embodiments, semiconductor plug 220 includes single crystalline silicon that is part of substrate 202. In other words, semiconductor plug 220 can include an epitaxially-grown semiconductor layer that is the same as the material of substrate 202. In this case, semiconductor plug 220 can also be referred to as an SEG plug. Semiconductor plug 220 can function as a channel controlled by a source select gate of NAND memory string 204.

Channel plug 222 can be at the upper end of NAND memory string 204 and in contact with channel structure 210 (e.g., on the upper end of channel structure 210). Channel plug 222 can include semiconductor materials (e.g., polysilicon) or conductive materials (e.g., metals). In some embodiments, channel plug 222 includes an opening filled with Ti/TiN or Ta/TaN as a glue layer and tungsten as a conductor layer. By covering the upper end of channel structure 210 during the fabrication of 3D memory device 200, channel plug 222 can function as an etch stop layer to prevent etching of dielectrics filled in channel structure 210, such as silicon oxide and silicon nitride. In some embodiments, channel plug 222 also functions as the drain of NAND memory string 204.

As shown in FIG. 2, 3D memory device 200 further includes slit structures 224. Each slit structure 224 can extend vertically through memory stack 206. Slit structure 224 can also extend laterally to separate memory stack 206 into multiple blocks. Slit structure 224 can include an opening (slit) that provides access for the chemical precursor to form conductor layers 207. Slit structure 224 can include a slit contact (not shown), formed by filling the slit with conductive materials including, but not limited to, W, Co, Cu, Al, polysilicon, silicides, or any combination thereof. While FIG. 2 shows that 3D memory device 200 includes slit structures 224, the devices, methods, and systems disclosed herein are also applicable to memory devices that do not include such slit structures.

Different from FIG. 1A in which insulation layer 130 is made of deposited silicon oxide, as shown in FIG. 2, a dielectric etch stop layer 230 is formed on substrate 202, reducing or even preventing nitrogen-related defects from forming and allowing semiconductor plug 220 to be disposed on the upper surface of substrate 202 instead of extending into substrate 202. As a result, semiconductor plug 220 has a substantially defect-free composition obtained by the novel fabrication methods disclosed herein. The lateral dimension of the upper and lower surface of semiconductor plug 220 can be substantially the same along the horizontal direction (the x-direction). In some embodiments, the lateral dimension of semiconductor plug 220 along the horizontal direction (the x-direction) is substantially the same across the width of semiconductor channel 212. That is, semiconductor plug 220 can have a substantially uniform upper and lower surface.

In some embodiments, the thickness of dielectric etch stop layer 230 is not greater than 20 nm, such as not greater than 20 nm. In some embodiments, the thickness of dielectric etch stop layer 230 is between about 1 nm to about 20 nm, such as between 1 nm and 20 nm (e.g., 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, any range bounded by the lower end by any of these values, or in any range defined by any two of these values). The thickness of dielectric etch stop layer 230 can be in a range that is sufficiently thick to prevent etching underneath substrate 202, while on the other hand, that is not too thick to affect the electrical properties and performance of semiconductor plug 220 as a transistor channel.

In some embodiments, dielectric etch stop layer 230 is a high-k dielectric layer including any suitable high-k dielectric materials including, but not limited to, $Al_2O_3$, $HfO_2$, $Ta_2O_5$, $ZrO_2$, $TiO_2$, or any combination thereof. In some embodiments, high-k dielectric materials include any dielectrics having a dielectric constant, or k-value, higher than that of silicon nitride (k>7). In some embodiments, high-k dielectric materials include any dielectrics having a dielectric constant, or k-value, higher than that of silicon oxide (k>3.9).

In some embodiments, dielectric etch stop layer 230 is a native oxide layer formed by oxidizing part of substrate 202. The native oxide layer can include silicon oxide, silicon oxynitride, or combination thereof. As described below in detail, the native oxide layer can be formed in any suitable manners, such as by thermal oxidation or wet chemical oxidation (e.g., using chemicals containing ozone). Compared with insulation layer 130 formed by depositing silicon oxide onto the surface of substrate 102 using thin film deposition processes, the native oxide layer it is the own oxide of substrate 202. In some embodiments in which the native oxide layer is formed by thermal oxidation, the native oxide layer has a higher quality (e.g., higher density and/or higher dielectric strengths), with a cleaner interface (e.g., less dangling bonds at the interface), than a deposited oxide layer.

FIGS. 3A-3G illustrate an exemplary fabrication process for forming a 3D memory device having a dielectric etch stop layer for reducing defects in a semiconductor plug, according to some embodiments of the present disclosure.

Figure 3A:
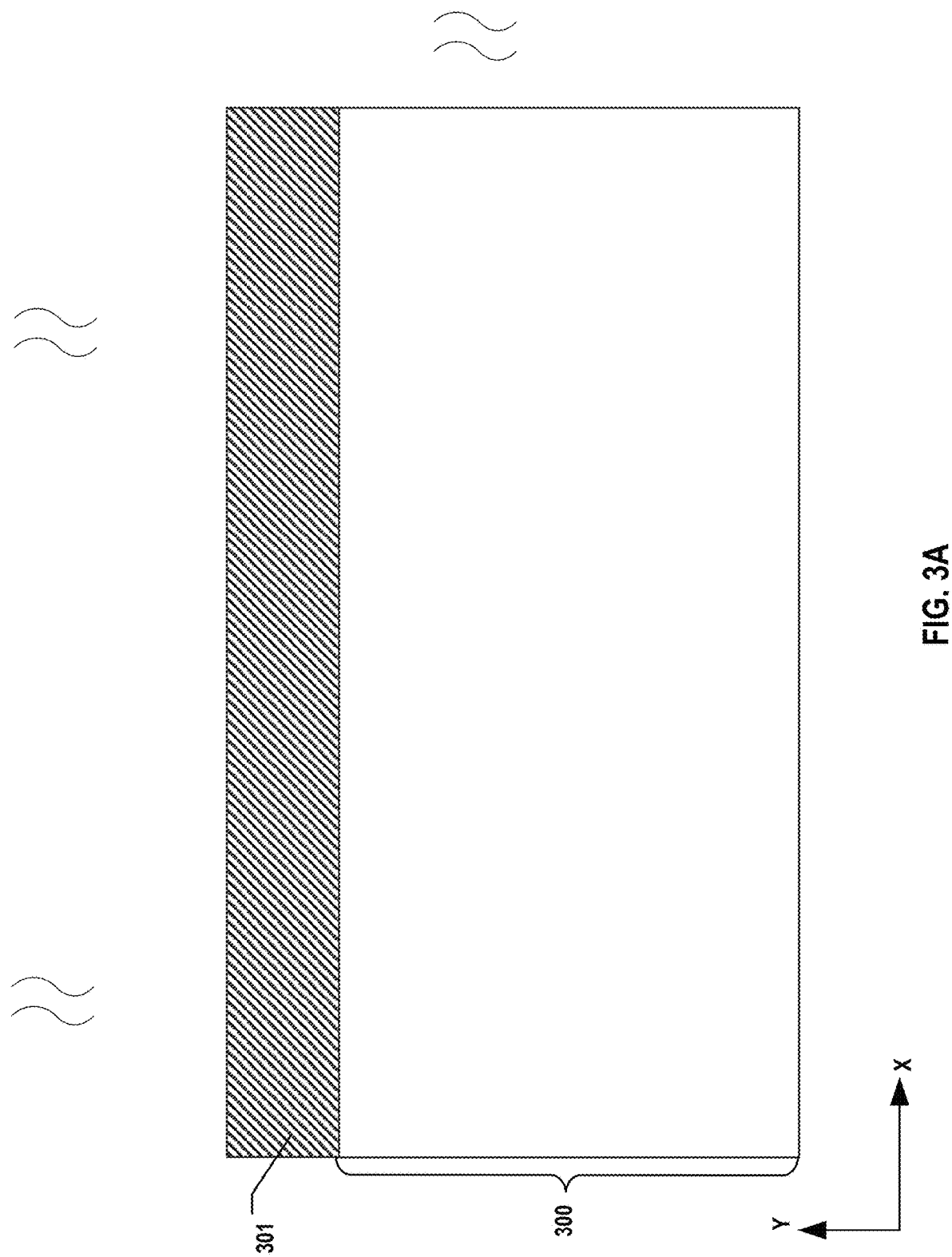
FIGS. 3A-3G illustrate an exemplary fabrication process for forming a 3D memory device having a dielectric etch stop layer for reducing defects in a semiconductor plug, according to some embodiments of the present disclosure.
Figure 3B:
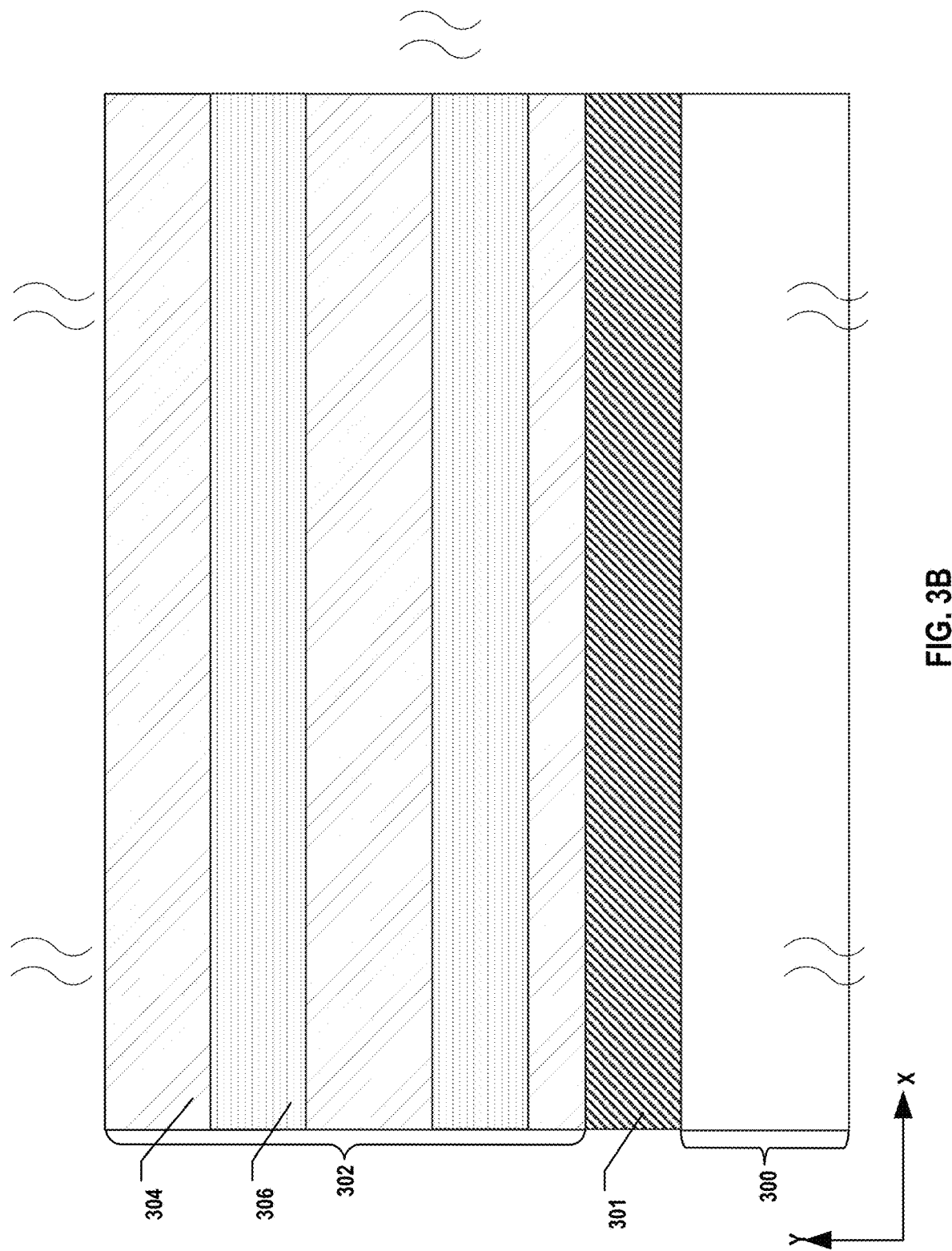
Figure 3C:
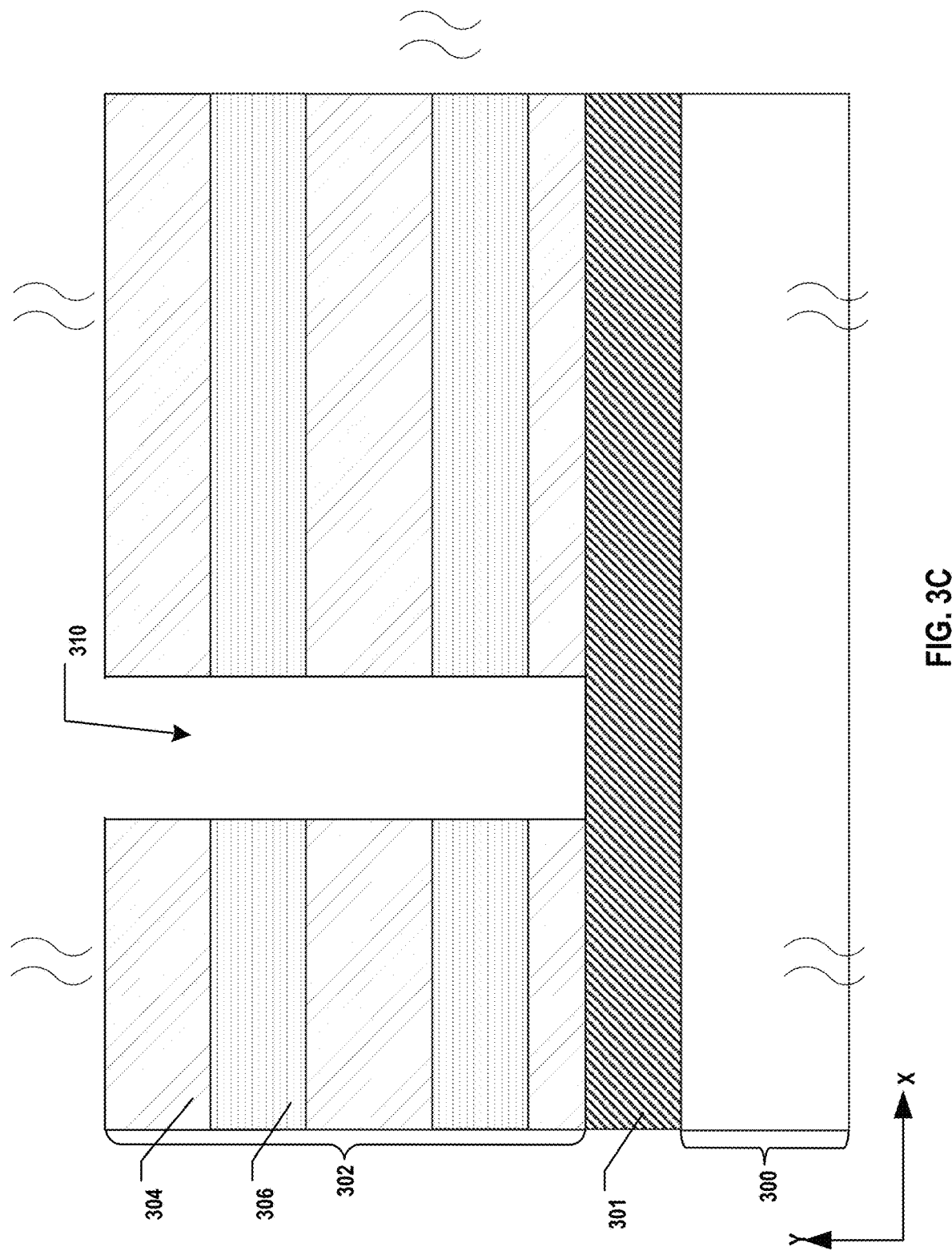
Figure 3D:
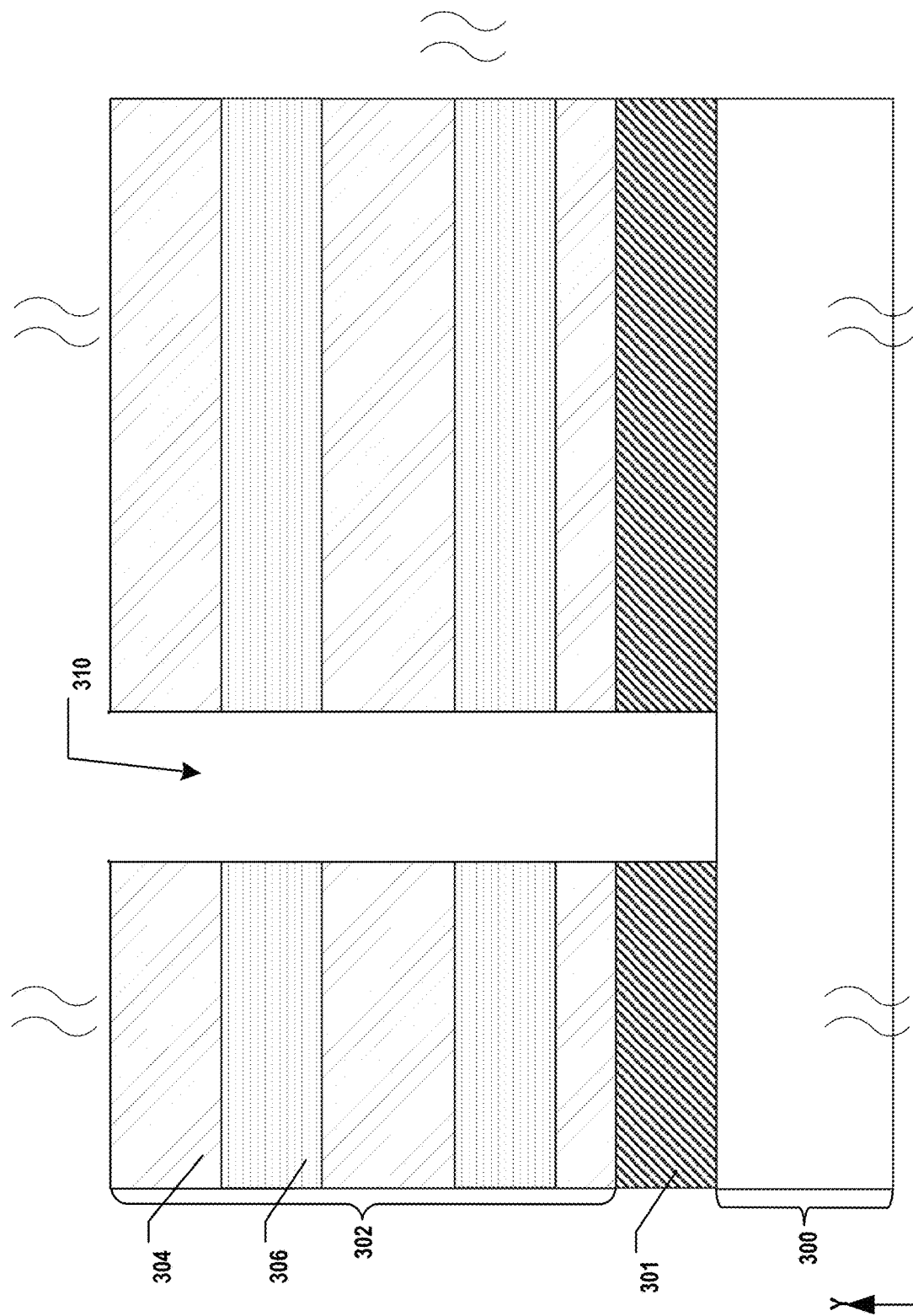
Figure 3E:
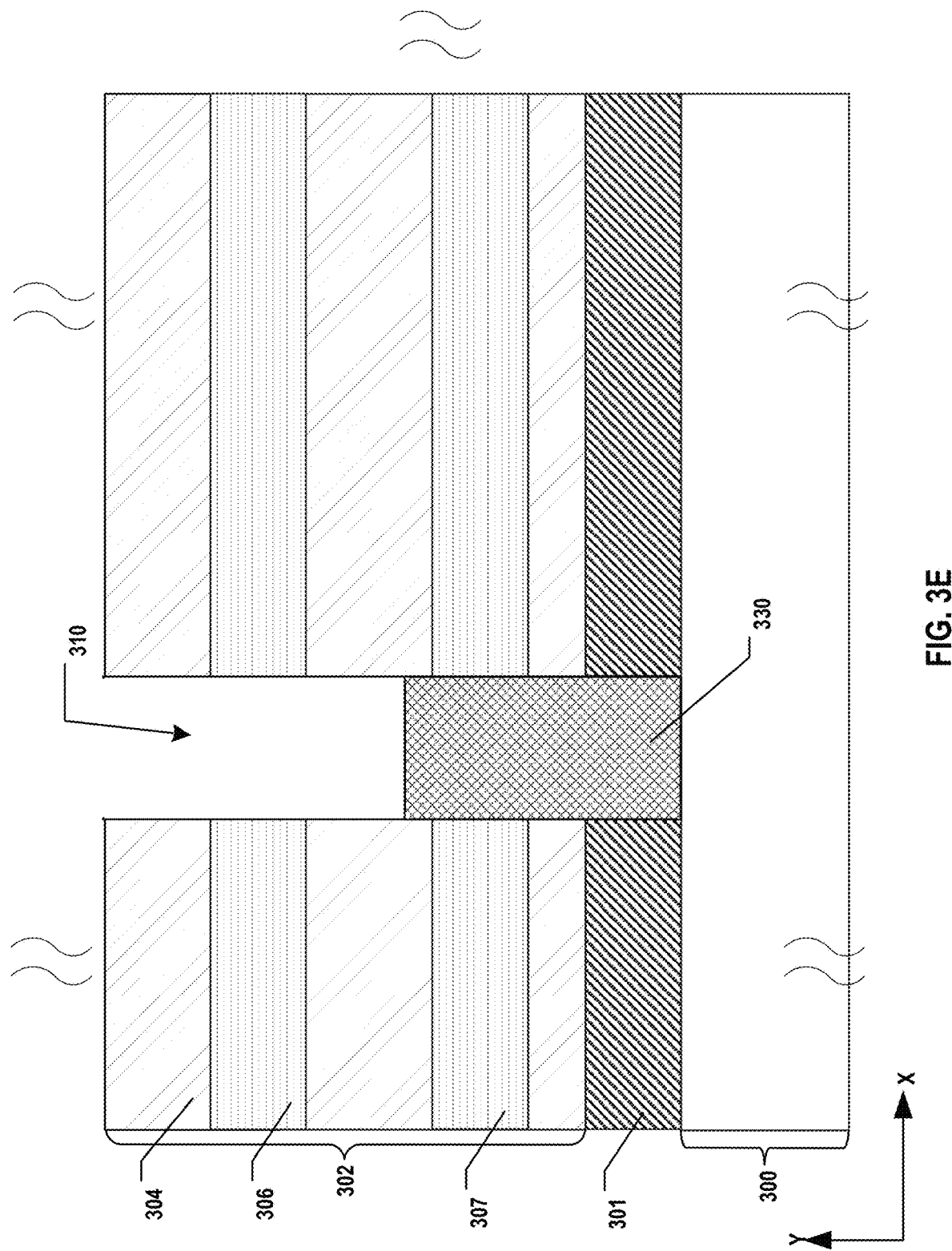
Figure 3F:
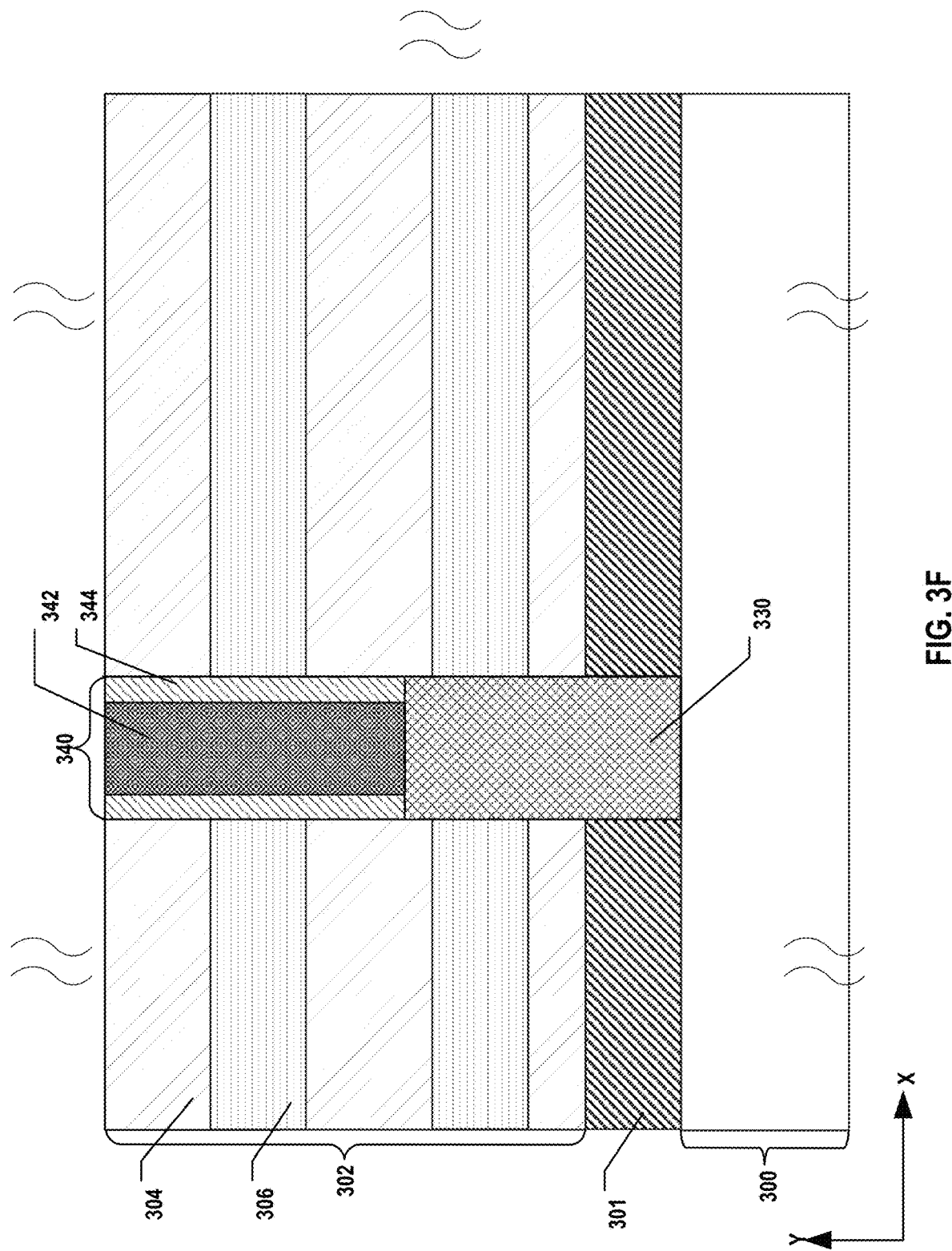
Figure 3G:
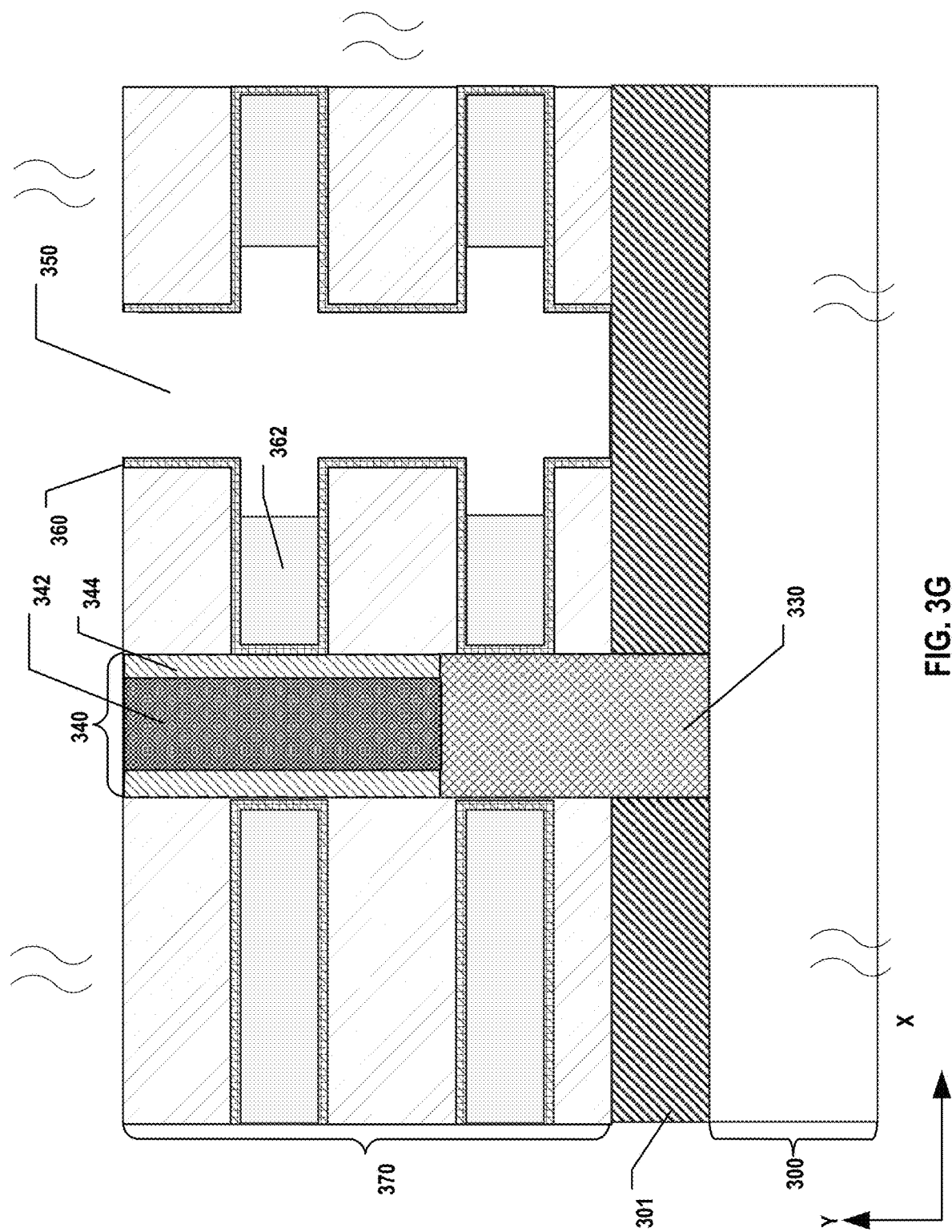
Figure 4:
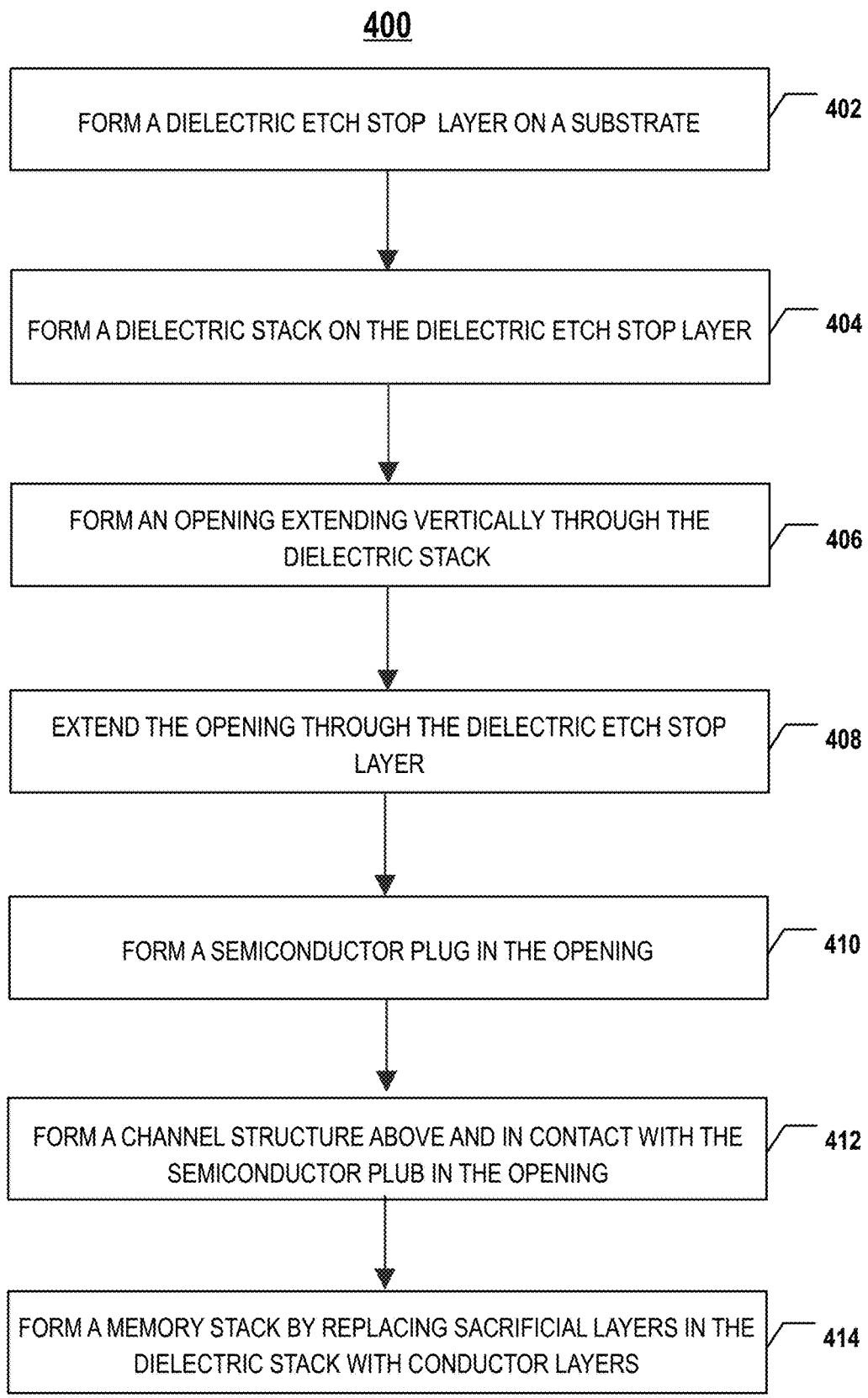
FIG. 4 is a flowchart of an exemplary method for forming a 3D memory device having a dielectric etch stop layer for reducing defects in a semiconductor plug, according to some embodiments of the present disclosure.

FIG. 4 is a flowchart of an exemplary method 400 for forming a 3D memory device having a dielectric etch stop layer for reducing defects in a semiconductor plug, according to some embodiments of the present disclosure. Examples of the 3D memory device depicted in FIGS. 3-4 include 3D memory devices 200 depicted in FIG. 2. FIGS. 3-4 will be described together. It is understood that the operations shown in method 400 are not exhaustive and that other operations can be performed as well before, after, or between any of the illustrated operations. Further, some of the operations may be performed simultaneously, or in a different order than shown in FIGS. 3-4.

Referring to FIG. 4, method 400 starts at operation 402, in which a dielectric etch stop layer is formed on a substrate. The substrate can be a silicon substrate. The thickness of dielectric etch stop layer can be between about 1 nm to about 20 nm, such as between 1 nm and 20 nm (e.g., 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, any range bounded by the lower end by any of these values, or in any range defined by any two of these values).

As illustrated in FIG. 3A, a dielectric etch stop layer 301 can be a high-k dielectric layer deposited on a substrate 300 (e.g., a silicon substrate). In some embodiments, the high-k dielectric layer may be made of high-k material(s) such as $Al_2O_3$, $HfO_2$, $Ta_2O_5$, $ZrO_2$, $TiO_2$, or any combination thereof. Dielectric etch stop layer 301 can be formed with the thickness in ranges described above by one or more thin film deposition processes including, but not limited to, chemical vapor deposition (CVD), physical vapor deposition (PVD), atomic layer deposition (ALD), or any combination thereof.

In some embodiments, dielectric etch stop layer 301 may be a native oxide layer formed by oxidizing part of substrate 300 with the thickness in ranges described above. Native oxide has a higher quality oxide film compared with deposited silicon oxide layer, which can block nitrogen diffusion. The native oxide layer can be formed in any suitable manners, such as by thermal oxidation or wet chemical oxidation (e.g., using chemicals containing ozone). For example, the native oxide layer can be formed by oxidizing the top portion of substrate 300. In some embodiments, the top portion of substrate 300 is oxidized by a thermal oxidation process. Either dry oxidation using molecular oxygen as the oxidant or wet oxidation using water vapor as the oxidant can be used to form the native oxide layer at a temperature between, for example, about 700° C. and about 1,200° C. (e.g., at about 850° C.). As thermal oxide incorporates silicon consumed from substrate 300 and oxygen supplied from the ambient, the native oxide layer can grow down into substrate 300, resulting in part of the native oxide layer thickness lying below the original top surface of substrate 300. The thickness of the resulting native oxide layer can be controlled by the thermal oxidation temperature and/or time.

The top portion of substrate 300 can also be oxidized by a wet chemical oxidation process. Wet chemicals including ozone can be used to oxidize part of substrate 300 to form a native oxide layer. In some embodiments, the wet chemical is a mixture of hydrofluoric acid and ozone (e.g., FOM). For example, the hydrofluoric acid has a concentration of 49% in the ultra-pure water. The thickness of the resulting native oxide layer can be controlled by the wet chemical compositions, temperature, and/or time. It is noted that dielectric etch stop layer 301 shown in FIG. 1A depicts a state after the top portion of substrate 300 is oxidized into a native oxide layer. Prior to the oxidization process, the original substrate includes space occupied by both 300 and part of 301.

Method 400 proceeds to operation 404, as illustrated in FIG. 4, in which a dielectric stack is formed on the dielectric etch stop layer. The dielectric stack can include a plurality of dielectric/sacrificial layer pairs. As illustrated in FIG. 3B, the bottom portion of a dielectric stack 302 is given in a close-up view, together with dielectric etch stop layer 301 and substrate 300. Pairs of a first dielectric layer 304 and a second dielectric layer (known as a "sacrificial layer") 306 (together referred to herein as "dielectric layer pairs") are formed on dielectric etch stop layer 301. Dielectric layers 304 and sacrificial layers 306 can be alternatively deposited on the dielectric etch stop layer 301 to form dielectric stack 302. In some embodiments, each dielectric layer 304 includes a layer of silicon oxide, and each sacrificial layer 306 includes silicon nitride. Dielectric stack 302 can be formed by one or more thin film deposition processes including, but not limited to, chemical vapor deposition (CVD), physical vapor deposition (PVD), atomic layer deposition (ALD), or any combination thereof.

Method 400 proceeds to operation 406, as illustrated in FIG. 4, in which an opening extending vertically through the dielectric stack is formed. As illustrated in FIG. 3C, an opening 310 (channel hole) is formed extending vertically through dielectric stack 302. In some embodiments, a plurality of openings 310 are formed through dielectric stack 302 such that each opening 310 becomes the location for growing an individual NAND memory string in the later process. In some embodiments, fabrication processes to form opening 310 include wet etching and/or dry etching, such as deep-ion reactive etching (DRIE). As shown in FIG. 3C, the etching process may proceed through dielectric stack 302 until it is stopped by the dielectric etch stop layer 301. In other words, dielectric etch stop layer 301 may stop the etching and prevent the etching from reaching substrate 300 underneath. In addition, gas compositions such as nitrogen generated during the etching process can be kept out of reach to substrate 300, thereby preventing the gas from attaching to the surface of the substrate. In this way, the surface of substrate 300 can be protected to allow uniform growth in subsequent SEG process.

Method 400 proceeds to operation 408, as illustrated in FIG. 4, in which the opening is extended through the dielectric etch stop layer. As illustrate in FIG. 3D, opening 310 can be punched through dielectric etch stop layer 301 to allow silicon to grow on top of substrate 300 and within opening 310. Dielectric etch stop layer 310 can be punched through by wet etching and/or drying etching part of the materials filled in opening 310.

Referring to FIG. 4, method 400 proceeds to operation 410, as illustrated in FIG. 4, in which a semiconductor plug is formed. In some embodiments, to form the semiconductor plug, a semiconductor layer is epitaxially grown from the substrate in the opening.

As illustrated in FIG. 3E, a semiconductor plug 330 can be formed by filling the lower portion of opening 310 with a semiconductor material, such as silicon, which is epitaxially grown from the substrate. It is understood that in some embodiments, semiconductor plug 330 includes single crystalline silicon that is part of the substrate. In some embodiments, semiconductor plug 330 neighbors more than one sacrificial layer (e.g., 306, 307). The fabrication processes for epitaxially growing semiconductor plug 330 can include, but not limited to, vapor-phase epitaxy (VPE), liquid-phase epitaxy (LPE), molecular-beam epitaxy (MPE), or any combinations thereof.

As shown in FIG. 3E, semiconductor plug 330 is disposed on substrate 300 (e.g., on the upper surface of substrate 300), not extending into substrate 300. This is because the upper surface of substrate 300 is not damaged during the etching process in operation 406, thanks to the dielectric etch stop layer 301. As a result, the lateral dimension in the horizontal direction of the upper surface of substrate 300 can be kept substantially uniform, allowing even growth of semiconductor plug 330 on top of the even upper surface of substrate 300. Different from the example in FIG. 1A in which semiconductor plug 116 can be epitaxially grown in different directions from substrate 102 (e.g., growing upward from the top surface of substrate 102 in the channel hole and/or growing inward from the sidewall of substrate 102 in the channel hole), semiconductor plug 330 in FIG. 3E can only be grown upward from the top surface of substrate 300 in opening 310.

Method 400 proceeds to operation 412, as illustrated in FIG. 4, in which a channel structure is formed above and in contact with the semiconductor plug in the opening. In some embodiments, to form the channel structure, a memory film is formed along the sidewall of the opening above the semiconductor plug, and a semiconductor channel extending vertically is formed over the memory film.

As illustrated in FIG. 3F, a channel structure 340 is formed above and in contact with semiconductor plug 330 in opening 310 (shown in FIG. 3E). Fabrication processes of forming channel structure 340 can include forming a semiconductor channel 342 and a memory film 344 disposed laterally between semiconductor channel 342 and the dielectric layer pairs of dielectric stack 302. In some embodiments, memory film 344 is first deposited along the sidewall of opening 310 above semiconductor plug 330, and semiconductor channel 342 is then deposited over memory film 344, extending vertically through dielectric stack 302. Semiconductor channel 342 can include semiconductor materials, such as polysilicon. Memory film 344 can be a composite dielectric layer, such as a combination of a tunneling layer, a storage layer, and a blocking layer (not shown). Each layer in memory film 344 can include dielectric materials including, but not limited to, silicon oxide, silicon nitride, silicon oxynitride, or any combination thereof. Semiconductor channel 342 and memory film 344 can be formed by one or more thin film deposition processes, such as ALD, CVD, PVD, any other suitable processes, or any combination thereof.

Method 400 proceeds to operation 414, as illustrated in FIG. 4, in which a memory stack is formed by replacing the sacrificial layers in the dielectric stack with conductor layers. The memory stack thus can include interleaved conductor layers and dielectric layers. In some embodiments, to form the memory stack, a slit is formed through the dielectric stack, the sacrificial layers in the dielectric stack are etched through the slit to form a plurality of lateral recesses, gate dielectric layers are deposited along sidewalls of the slit and the lateral recesses, and the conductor layers are deposited over the gate dielectric layers.

As illustrated in FIG. 3G, gate dielectric layers 360 and conductor layers 362 (gate conductors) are formed subsequently in this order along the sidewalls of a slit 350. Conductor layers 362 are then partially removed by wet etching and/or dry etching, according to some embodiments. As a result, a memory stack 370 can be formed, replacing dielectric stack 302 by the so-called gate replacement processes. Gate dielectric layers 360 and conductor layers 362 can be formed by one or more thin film deposition processes, such as ALD, CVD, PVD, any other suitable processes, or any combination thereof. Gate dielectric layers 360 can include dielectric materials including silicon nitride, high-k dielectrics, such as $Al_2O_3$, $HfO_2$, $Ta_2O_5$, or any combination thereof. Conductor layers 426 can include conductive materials including, not limited to, W, Co, Cu, Al, polysilicon, silicides, or any combination thereof. In some embodiments, the remaining space of slit 350 after the gate replacement processes illustrated in FIG. 3G is filled with filling materials, such as dielectric(s) (as a spacer) and conductive materials (as an adhesion/barrier layer and a conductor layer), to form a slit contact (not shown) extending vertically through memory stack 370.

Figure 5:
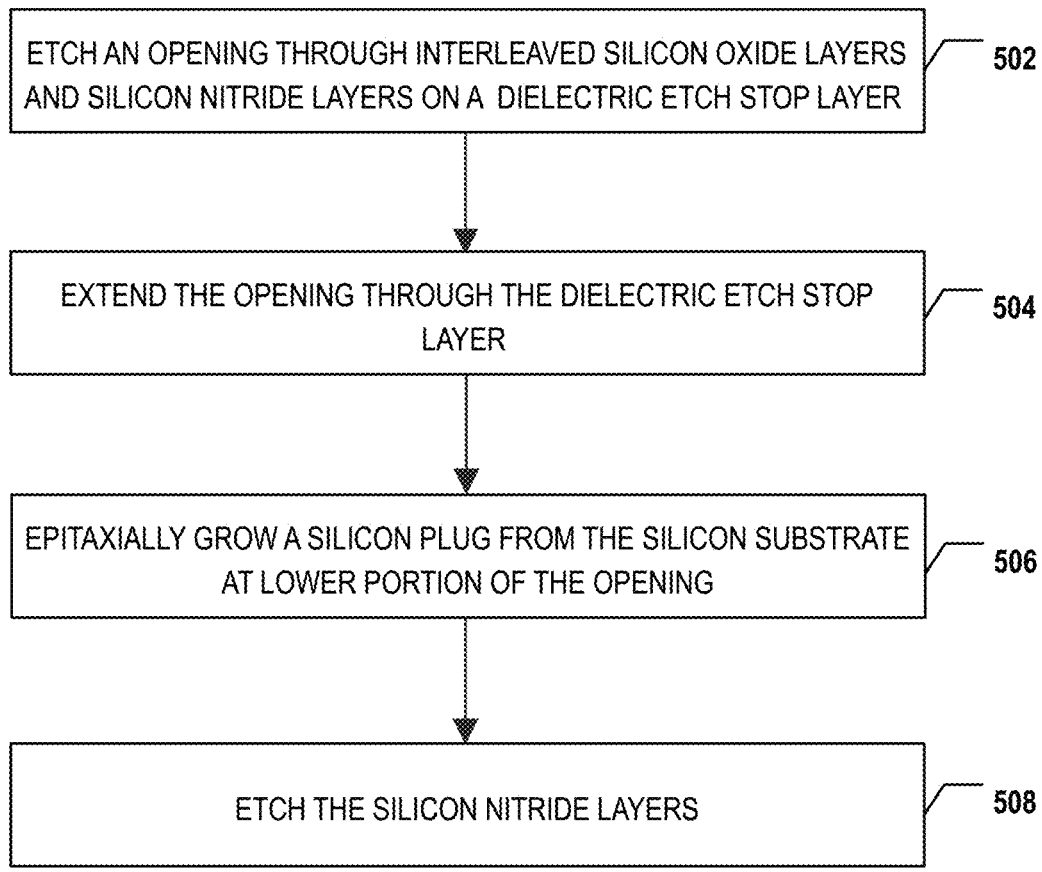
FIG. 5 is a flowchart of an exemplary method for forming a semiconductor structure having a dielectric etch stop layer for reducing defects in a semiconductor plug, according to some embodiments of the present disclosure.

It should be understood that the application of a dielectric etch stop layer for reducing defects in a semiconductor plug is not limited to a 3D memory device only. A more generic device can be any semiconductor structure having a semiconductor plug. FIG. 5 is a flowchart of an exemplary method 500 for forming such a semiconductor structure with a dielectric etch stop layer for reducing defects in a semiconductor plug, according to some embodiments. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which an opening is formed through a dielectric stack including interleaved silicon oxide layers and silicon nitride layers on a dielectric etch stop layer formed on a substrate. Fabrication processes for forming the dielectric etch stop layer and the silicon oxide/silicon nitride dielectric stack and the opening are similar to those depicted with reference to FIGS. 3A-3C, and thus are not be repeated here. It should be noted that the silicon oxide layer and the silicon nitride layer function as the dielectric layer and the sacrificial layer in the dielectric stack, respectively.

Method 500 proceeds to operation 504, as illustrated in FIG. 5, in which the opening is extended through the dielectric etch stop layer by, for example, punching through the dielectric etch stop layer. Fabrication processes for extending the opening through the dielectric etch stop layer are similar to those depicted with reference to FIG. 3D, and thus are not be repeated here.

Method 500 proceeds to operation 506, as illustrated in FIG. 5, in which a silicon plug is formed from the substrate at the lower portion of the opening. The silicon plug can be epitaxially grown from the substrate and have the same material as the substrate. Because the dielectric etch stop layer can reduce nitrogen accumulation and attachment to the silicon surface and can retain uniform and even upper surface of the substrate, defects in silicon plug can be reduced or prevented. Thus, the lower and upper surfaces of the silicon plug can be formed evenly.

Method 500 proceeds to operation 508, as illustrated in FIG. 5, in which the silicon nitride layers are etched out. The etchant can include wet chemicals such as phosphoric acid. The finished silicon plug can have substantially the same lateral dimension along the horizontal direction (i.e., a substantially straight upper and lower surface profile).

According to one aspect of the present disclosure, a method for forming a 3D memory device is disclosed. A dielectric etch stop lay is formed. The dielectric etch stop layer is disposed on a substrate. A dielectric stack is then formed on the dielectric etch stop layer. The dielectric stack includes a plurality of interleaved dielectric layers and sacrificial layers. An opening extending vertically through the dielectric stack is formed. The opening is then extended through the dielectric etch stop layer. A SEG plug is formed at a lower portion of the opening. The SEG plug is disposed on the substrate. A channel structure is formed above and in contact with the SEG plug in the opening. A memory stack including a plurality of interleaved dielectric layers and conductor layers is formed by replacing the sacrificial layers in the dielectric stack with the conductor layers.

In some embodiments, to form the dielectric etch stop layer, a high-K dielectric layer is deposited on the substrate. The high-k dielectric layer may include at least one of $Al_2O_3$, $HfO_2$, $Ta_2O_5$, $ZrO_2$, or $TiO_2$.

In some embodiments, to form the dielectric etch stop layer, a native oxide layer is formed by oxidizing part of the substrate.

In some embodiments, to extend the opening through the dielectric etch stop layer, the dielectric etch stop layer may be punched through.

In some embodiments, the substrate includes silicon, and each of the sacrificial layers includes silicon nitride.

In some embodiments, to form the SEG plug, a semiconductor layer is epitaxially grown from the substrate in the opening.

In some embodiments, to form the channel structure, a memory film is formed along the sidewall of the opening above the SEG plug, and a semiconductor channel extending vertically is formed over the memory film.

In some embodiments, to form the memory stack, a slit through the dielectric stack, the sacrificial layers in the dielectric stack are etched through the slit to form a plurality of lateral recesses, gate dielectric layers are deposited along sidewalls of the slit and the lateral recesses, and the conductor layers are deposited over the gate dielectric layers. In some embodiments, to etch the sacrificial layers, an etchant including phosphoric acid is applied through the opening.

In some embodiments, etching though the dielectric stack in the process of forming the opening may be stopped by the dielectric etch stop layer.

In some embodiments, a thickness of the dielectric etch stop layer is between about 1 nm and about 20 nm.

According to another aspect of the present disclosure, a method for forming a semiconductor structure is disclosed. A dielectric etch stop layer is formed. The dielectric etch stop layer is disposed on a substrate. A plurality of interleaved dielectric layers and sacrificial layers are formed on the dielectric etch stop layer. An opening extending vertically through the interleaved dielectric layers and sacrificial layers is formed. The opening is extended through the dielectric etch stop layer. A SEG plug is formed at a lower portion of the opening. The SEG plug is disposed on the substrate.

In some embodiments, to form the dielectric etch stop layer, a high-K dielectric layer is deposited on the substrate. The high-k dielectric layer may include at least one of $Al_2O_3$, $HfO_2$, $Ta_2O_5$, $ZrO_2$, or $TiO_2$.

In some embodiments, to form the dielectric etch stop layer, a native oxide layer is formed by oxidizing part of the substrate.

In some embodiments, to extend the opening through the dielectric etch stop layer, the dielectric etch stop layer may be punched through.

In some embodiments, the sacrificial layers are removed.

In some embodiments, the substrate includes silicon, and each of the sacrificial layers includes silicon nitride.

In some embodiments, to form the SEG plug, a semiconductor layer is epitaxially grown from the substrate in the opening.

In some embodiments, the method also includes forming a channel structure. A memory film is formed along the sidewall of the opening above the SEG plug, and a semiconductor channel extending vertically is formed over the memory film.

In some embodiments, the method also includes forming the memory stack. A slit through the interleaved dielectric layers and sacrificial layers, the sacrificial layers in the dielectric stack are etched through the slit to form a plurality of lateral recesses, gate dielectric layers are deposited along sidewalls of the slit and the lateral recesses, and the conductor layers are deposited over the gate dielectric layers. In some embodiments, to etch the sacrificial layers, an etchant including phosphoric acid is applied through the opening.

According to still another aspect of the present disclosure, a 3D memory device is provided. The memory device includes a substrate, a dielectric etch stop layer disposed on the substrate, a memory stack disposed on the dielectric etch stop layer and including a plurality of interleaved conductor layers and dielectric layers, and a plurality of memory strings each extending vertically through the memory stack and including a SEG plug at a bottom portion of the memory string. The SEG plug is disposed on the substrate.

In some embodiments, the dielectric etch stop layer is a high-k dielectric layer. The high-k dielectric layer includes at least one of $Al_2O_3$, $HfO_2$, $Ta_2O_5$, $ZrO_2$, or $TiO_2$.

In some embodiments, the dielectric etch stop layer is a native oxide layer formed by oxidizing part of the substrate.

In some embodiments, the SEG plug includes an epitaxially-grown semiconductor layer that is the same as a material of the substrate.

In some embodiments, each of the memory strings further includes a semiconductor channel extending vertically through the interleaved conductor layers and dielectric layers and a memory film disposed laterally between the semiconductor channel and the interleaved conductor layers and dielectric layers.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming a dielectric etch stop layer, wherein the dielectric etch stop is disposed on a substrate;
   forming a dielectric stack on the dielectric etch stop layer, the dielectric stack comprising a plurality of interleaved dielectric layers and sacrificial layers;
   forming an opening extending vertically through the dielectric stack;
   extending the opening through the dielectric etch stop layer such that a bottom of the opening is flush with a bottom surface of the dielectric etch stop layer on the substrate;
   forming a selective epitaxial growth (SEG) plug at a lower portion of the opening, wherein the SEG plug is disposed on the substrate, and a bottom surface of the SEG plug is flush with the bottom surface of the dielectric etch stop layer;
   forming a channel structure above and in contact with the SEG plug in the opening; and
   forming a memory stack comprising a plurality of interleaved dielectric layers and conductor layers by replacing the sacrificial layers in the dielectric stack with the conductor layers.

2. The method of claim 1, wherein forming the dielectric etch stop layer comprises depositing a high-k dielectric layer on the substrate.

3. The method of claim 2, wherein the high-k dielectric layer comprises at least one of aluminum oxide ($Al_2O_3$), hafnium oxide ($HfO_2$), tantalum oxide ($Ta_2O_5$), zirconium oxide ($ZrO_2$), or titanium oxide ($TiO_2$).

4. The method of claim 1, wherein forming the dielectric etch stop layer comprises oxidizing part of the substrate to form a native oxide layer.

5. The method of claim 1, wherein extending the opening through the dielectric etch stop layer includes punching through the dielectric etch stop layer.

6. The method of claim 1, wherein forming the SEG plug comprises epitaxially growing a semiconductor layer from the substrate in the opening.

7. The method of claim 1, wherein forming the channel structure comprises:
   forming a memory film along a sidewall of the opening above the SEG plug; and
   forming a semiconductor channel extending vertically over the memory film.

8. The method of claim 1, wherein forming the memory stack comprises:
   forming a slit through the dielectric stack;
   etching the sacrificial layers in the dielectric stack through the slit to form a plurality of lateral recesses;
   depositing gate dielectric layers along sidewalls of the slit and the lateral recesses; and
   depositing the conductor layers over the gate dielectric layers.

9. The method of claim 1, wherein a thickness of the dielectric etch stop layer is between about 1 nm and about 20 nm.

10. A method for forming a semiconductor structure, comprising:
- forming a dielectric etch stop layer, the dielectric etch stop layer being disposed on a substrate;
- forming a plurality of interleaved dielectric layers and sacrificial layers on the dielectric etch stop layer;
- forming an opening extending vertically through the interleaved dielectric layers and sacrificial layers;
- extending the opening through the dielectric etch stop layer such that a bottom of the opening is flush with a bottom surface of the dielectric etch stop layer on the substrate; and
- forming a selective epitaxial growth (SEG) plug at a lower portion of the opening, the SEG plug being disposed on the substrate, a bottom surface of the SEG plug being flush with the bottom surface of the dielectric etch stop layer.

11. The method of claim 10, wherein forming the dielectric etch stop layer comprises depositing a high-k dielectric layer on the substrate.

12. The method of claim 11, wherein the high-k dielectric layer comprises at least one of aluminum oxide ($Al_2O_3$), hafnium oxide ($HfO_2$), tantalum oxide ($Ta_2O_5$), zirconium oxide ($ZrO_2$), or titanium oxide ($TiO_2$).

13. The method of claim 10, wherein forming the dielectric etch stop layer comprises oxidizing part of the substrate to form a native oxide layer.

14. The method of claim 10, wherein extending the opening through the dielectric etch stop layer includes punching through the dielectric etch stop layer.

15. The method of claim 10, further comprising removing the sacrificial layers.

16. The method of claim 10, wherein the substrate comprises silicon, and each of the sacrificial layers comprises silicon nitride.

17. The method of claim 10, wherein forming the SEG plug comprises epitaxially growing a semiconductor layer from the substrate in the opening.

18. The method of claim 10, further comprising forming a channel structure, comprising:
- forming a memory film along a sidewall of the opening above the SEG plug; and
- forming a semiconductor channel extending vertically over the memory film.

19. The method of claim 10, further comprising forming a memory stack, comprising:
- forming a slit through the interleaved dielectric layers and sacrificial layers;
- etching the sacrificial layers through the slit to form a plurality of lateral recesses;
- depositing gate dielectric layers along sidewalls of the slit and the lateral recesses; and
- depositing conductor layers over the gate dielectric layers.

20. A method for forming a three-dimensional (3D) memory device, comprising:
- forming a dielectric etch stop layer, wherein the dielectric etch stop is disposed on a substrate;
- forming a dielectric stack on the dielectric etch stop layer, the dielectric stack comprising a plurality of interleaved dielectric layers and sacrificial layers;
- etching through the dielectric stack to form an opening extending vertically through the dielectric stack, wherein the etching is stopped by the dielectric etch stop layer;
- extending the opening through the dielectric etch stop layer such that a bottom of the opening is flush with a bottom surface of the dielectric etch stop layer on the substrate;
- forming a selective epitaxial growth (SEG) plug at a lower portion of the opening, wherein the SEG plug is disposed on the substrate, and a bottom surface of the SEG plug is flush with the bottom surface of the dielectric etch stop layer;
- forming a channel structure above and in contact with the SEG plug in the opening; and
- forming a memory stack comprising a plurality of interleaved dielectric layers and conductor layers by replacing the sacrificial layers in the dielectric stack with the conductor layers.

* * * * *